US006576565B1

(12) United States Patent
Chakravarti et al.

(10) Patent No.: US 6,576,565 B1
(45) Date of Patent: Jun. 10, 2003

(54) RTCVD PROCESS AND REACTOR FOR IMPROVED CONFORMALITY AND STEP-COVERAGE

(75) Inventors: Ashima Chakravarti, Hopewell Junction, NY (US); Oleg Gluschenkov, Wappingers Falls, NY (US); Irene Lennox McStay, Hopewell Junction, NY (US)

(73) Assignees: Infineon Technologies, AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/075,152

(22) Filed: Feb. 14, 2002

(51) Int. Cl.$^7$ ................................................ H01L 21/31
(52) U.S. Cl. ...................... 438/758; 438/760; 438/243; 118/724
(58) Field of Search ................................. 438/758, 760, 438/243; 118/724

(56) References Cited

U.S. PATENT DOCUMENTS

| | | | |
|---|---|---|---|
| 5,192,708 A | 3/1993 | Beyer et al. | |
| 5,518,946 A | 5/1996 | Kuroda | |
| 6,110,289 A | 8/2000 | Moore | |
| 6,215,106 B1 * | 4/2001 | Boas et al. | 118/724 |
| 6,232,196 B1 * | 5/2001 | Raaijmakers et al. | 438/243 |
| 6,281,066 B1 | 8/2001 | Song et al. | |
| 6,313,443 B1 * | 11/2001 | Harnik et al. | 118/724 |
| 6,395,099 B1 * | 5/2002 | Pan | 134/1 |
| 6,435,869 B2 * | 8/2002 | Kitamura | 432/253 |
| 6,437,290 B1 * | 8/2002 | Shao et al. | 219/390 |

OTHER PUBLICATIONS

Wolf, S. and Tauber, R. N., "Silicon Processing for the VLSI Era, vol. 1—Process Technology", 2000, pp. 194–198, Second Edition, Lattice Press, Sunset Beach, California.

* cited by examiner

Primary Examiner—John F. Niebling
Assistant Examiner—Olivia T Luk
(74) Attorney, Agent, or Firm—Slater & Matsil, L.L.P.

(57) ABSTRACT

An apparatus (110) and method for depositing material on a semiconductor wafer with non-planar structures (114). The wafer (114) is positioned in a chamber (111), and reactive gases (132) are introduced into the chamber (111). The gases (132) and wafer (114) are heated, wherein the gas (132) temperature in the process chamber (111) and in the vicinity of the wafer (114) surface is lower than the temperature of the wafer (114) surface. A material is deposited on the wafer (114) surface using chemical vapor deposition. A gas cooler may be utilized to lower the temperature of the reactive gases (132) while the wafer (114) is heated.

20 Claims, 5 Drawing Sheets

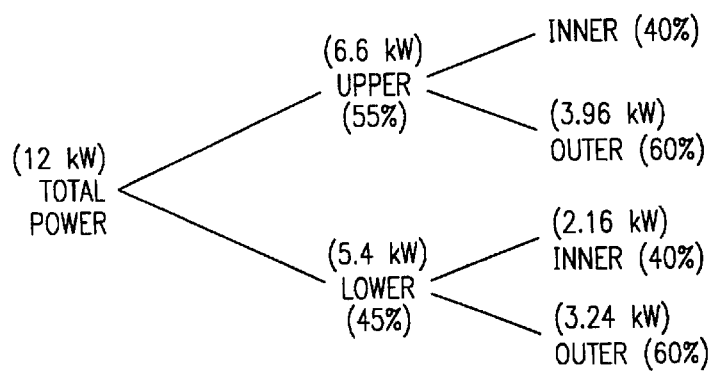
*FIG. 2*
*(PRIOR ART)*
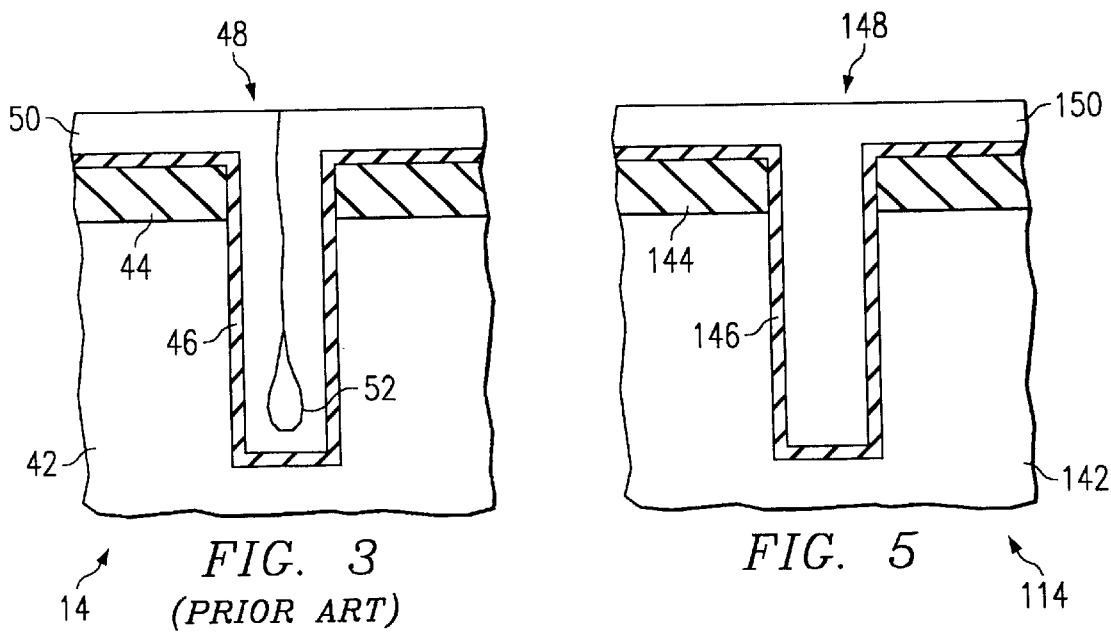
*FIG. 3*
*(PRIOR ART)*
*FIG. 5*
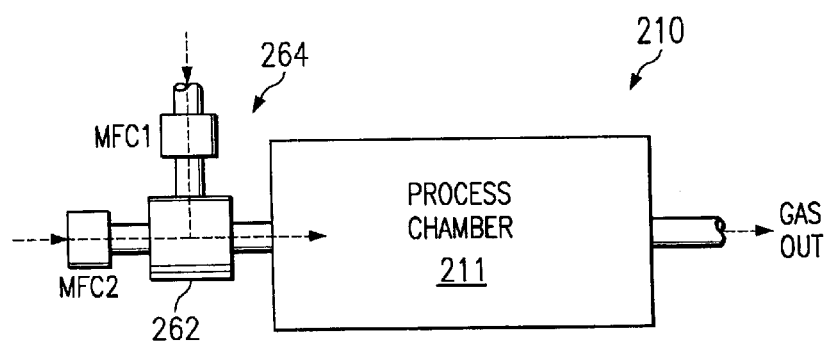
*FIG. 6*

RTCVD PROCESS AND REACTOR FOR IMPROVED CONFORMALITY AND STEP-COVERAGE

CROSS-REFERENCE TO RELATED APPLICATIONS

Embodiments of the present invention are related to patent application Ser. No. 09/895,378 filed on Jun. 29, 2001 by Gluschenkov et al., entitled "Method for educing the Microloading Effect in a Chemical Vapor Deposition Reactor", which is incorporated herein by reference.

TECHNICAL FIELD

The present invention relates generally to the fabrication of integrated circuits (IC's), and more particularly to the conformal deposition of materials onto high-aspect-ratio three dimensional (3D) microstructures.

BACKGROUND

Semiconductor devices are used in a variety of electronic applications, such as personal computers and cellular phones, as examples. The deposition of a film on the surface of a semiconductor substrate is a common step in semiconductor processing. Typically, selected chemical gases are mixed in a deposition chamber containing the semiconductor substrate. Usually, heat is applied to drive the chemical reaction of the gases on the surface of the substrate on which the film is deposited.

A semiconductor memory device is a semiconductor product widely used in electronic systems for storing data. A common type of semiconductor memory device is a dynamic random access memory (DRAM). A DRAM typically includes millions or billions of individual DRAM cells, with each cell storing one bit of data. A DRAM memory cell typically includes an access field effect transistor (FET) and a storage capacitor. The access FET allows the transfer of data charges to and from the storage capacitor during reading and writing operations. In addition, the data charges on the storage capacitor are periodically refreshed during a refresh operation. The semiconductor industry in general is being driven to decrease the size of semiconductor devices located on integrated circuits. Miniaturization is generally needed to accommodate the increasing density of circuits necessary for today's semiconductor products.

The desire for even higher levels of circuit integration has stimulated three-dimensional integration. Indeed, if devices can be stacked on top of each other, a higher number of the devices can be integrated per unit of chip area. For instance, instead of planar capacitors, deep trench capacitors are extensively used in DRAM and embedded DRAM (eDRAM) memory cells to reduce the cell area.

A 3D cell capacitor is basically formed by first creating a deep trench in a silicon substrate, forming a first electrode, depositing a thin conformal dielectric film inside the trench, and then filling the trench with doped polycrystalline silicon (polysilicon) to form the other electrode of the capacitor. Continuous 3-D scaling of memory cells requires narrow deep trenches having aspect ratios (the ratio of the depth of the trench to the width of the trench opening) of 10:1 and greater.

In some cases, bottle-shaped trenches are employed to increase the trench surface area while keeping constant opening. Filling high-aspect-ratio 3-D microstructures with polysilicon is particularly difficult. Enhanced polysilicon growth on top of the wafers than on the sides of the trenches causes polysilicon bread-loafing and pinching off at the trench top, leaving voids in the lower part of the trenches. Generally, there is a continuous need for processes and tools that allow conformal deposition of material onto high-aspect-ratio (3-D) structures.

There are a variety of methods for improving film conformality in the art. A number of physical parameters are known to be responsible for controlling the conformality of a deposited film. For example, S. Wolf and R. N. Tauber, in the process technology reference book "*Silicon Processing for the VLSI Era*, Volume 1 Process Technology" by, $2^{nd}$ edition, Lattice Press, Sunset Beach, Calif. 2000, at pp. 194–198 summarize the conformal deposition of thin films. Wolf et al. teach that there are three physical parameters responsible for controlling the conformality of a deposited film: adatom migration, re-emission of radicals and molecules, and molecular mean free pass in the process gas.

Adatom migration refers to the process of transporting adsorbed molecules along wafer surface before final attachment or chemisorption. The higher the adatom mobility, the longer the molecule can travel along a microstructure surface, and the better the film conformality. Re-emission refers to the molecular transport by multiple wall collisions due to a low sticking coefficient. If an active molecule can repeatedly bounce off the microstructure surface, it can be more easily delivered to a remote corner of the microstructure. Accordingly, the lower the sticking coefficient, the higher the re-emission rate, and the better the film conformality. Molecular mean free pass in the process gas determines the gas phase transport of active chemicals to various parts of a microstructure. If the mean free pass is substantially larger than all dimensions of a microstructure, then active molecules travel along straight lines without any gas phase scattering within the microstructure.

In this regime, the rates of re-emission and adatom migration must be high enough to overcome the effect of geometrical shadowing. If the mean free pass is substantially smaller than the microstructure, then active gas molecules experience gas phase scattering within the microstructure. In this regime, the flux of active chemicals is a function of the arrival angle range. The wider the arrival angle range, the higher the flux.

For instance, an upper corner of a trench has the range of between 0 and 270 degrees, while the bottom corner of a trench has the range of between 0 and 90 degrees. If there is little adatom migration, then the upper corner would have thicker film, causing pinch-off.

Wolf et al. also teach the selection of processing parameters for reducing or eliminating non-conformal deposition. Accordingly, the adatom mobility may be increased by (a) raising substrate temperature, and (b) supplying high-energy particles (e.g. ions, electrons, photons, etc.) during the deposition. It is also known in the art that the adatom mobility can be affected by the surface coverage with active chemicals. In general, a lower partial pressure of a chemical may lead to a lower surface coverage by the chemical. However, depending on a particular chemical, the adatom mobility may either increase or decrease with the surface coverage. Consequently, the adatom mobility may be altered by changing pressure or partial pressure. Wolf et al. also teach that the rate of re-emission can be increased by selecting an active chemical with low sticking coefficient.

For example, a deposition of polysilicon onto high-aspect-ratio structures is typically conducted at low pressure and relatively high temperature. A typical pressure range of 0.2 to 1 Torr ensures a relatively low growth rate. The mean free pass is approximately between 2 mm and 400 μm. The mean free pass is substantially larger than the typical size of a microstructure which is e.g., from 100 nm to 10 μm. A typical temperature range of from 600 degrees C. to 700 degrees C. provides an acceptable surface mobility and re-emission rate. A typical growth rate is from 0.5 to 5 Angstroms per minute. It is the low growth rate in comparison to the rates of re-emission, adatom migration, and gas phase delivery of chemicals that provides a conformal deposition of polysilicon film.

Typically, filling a deep trench with polysilicon is accomplished in a vertical furnace. A vertical furnace is a batch-type reactor which can process up to 200 substrates at once. Due to the large batch size, a vertical furnace can be used for low growth rate processes. Furnace processes usually give very conformal films; however, small seam voids may be formed at the middle or lower part of the trenches, especially in high aspect ratio trenches, which is undesirable.

Another goal in the fabrication of semiconductors is to increase the flexibility of manufacturing lines by allowing processing of various products at the same time. Reduction of processing time in the presence of different products can be achieved with a smaller batch size, preferably single wafer fabrication, for example. In addition, recent trends in microfabrication are directed toward reduced thermal budget and processing of large substrates.

A new type of CVD reactor, characterized as a rapid thermal reactor, appears to satisfy these demands. A rapid thermal CVD (RTCVD) reactor is a single-wafer unit that processes one wafer at a time. In order to have a competitive throughput, a RTCVD reactor should have a substantially higher deposition rate in reference to a large-batch furnace. A preferred growth rate is approximately 10 to 20 Angstroms per second. Single wafer tools have also a small chamber volume. Wafers are heated by lamps or by resistively heating a susceptor. The processing gas is introduced either from a chamber wall or through a showerhead located above the wafer. The gas outlet opening is located in a chamber wall. A high growth rate, small volume, and close proximity of the heating source to the wafers gives rise to some challenging phenomena.

For instance, the deposition of polysilicon is conducted at a pressure range of from 120 to 200 Torr. The mean free pass is from 1 μm to 4 μm, which is comparable to the size of a typical microstructure. A typical temperature is from 600 degrees C. to 700 degrees C. A typical growth rate is from 5 to 20 Angstroms per second. It is the high growth rate in comparison to the rates of re-emission, adatom migration, and gas phase delivery of chemicals that make the RTCVD process susceptible to the poor conformality.

SUMMARY OF THE INVENTION

A novel method for improving conformality of RTCVD processes is disclosed herein. The method of the present invention does not require any change in substrate temperature, chamber pressure, type of the chemical precursor, or film growth rate in improving the conformality of material deposited on a wafer.

In addition, an improved RTCVD reactor is disclosed. The reactor provides means for controlling conformality of a deposition process independent from other process parameters such as substrate temperature, chamber pressure, type of the chemical precursor, or film growth rate.

Disclosed is a method of fabricating a semiconductor wafer, including providing a semiconductor wafer having non-planar structures with a 3-D surface, positioning the wafer in a chamber, and introducing reactive gases into the chamber. The gases and the wafer are heated, wherein the gas temperature in the chamber and in the vicinity of the wafer surface is more than 20% lower than the temperature of the wafer surface. A material is deposited on the wafer surface using chemical vapor deposition. A semiconductor wafer processed by the method is also disclosed.

Also disclosed is an apparatus for depositing a material on a semiconductor wafer, comprising a chamber, a gas delivery system including mass flow controllers for at least one reactive gas and at least one neutral gas coupled to the chamber, and a stage disposed within the chamber adapted to support a semiconductor wafer. The apparatus includes a means of heating the wafer to a specified temperature, a means of monitoring and controlling the wafer temperature, and a gas exhaust coupled to the chamber, the gas exhaust being coupled to a pump. The apparatus includes a means of monitoring and controlling the gas pressure within the chamber, and a stage including a gas cooler adapted to cool the at least one reactive gas before the at least one reactive gas enters the chamber, the gas cooler comprising a primary coolant.

Advantages of embodiments of the present invention include a method for depositing materials on a semiconductor wafer without forming seam voids, even in high aspect ratio trenches of a semiconductor wafer. The conformality of a deposition on a semiconductor wafer is improved in accordance with embodiments of the invention by heating the wafer and gas mixtures within the chamber substantially more beneath the wafer than above the wafer top surface. The bread-loafing problem seen in prior art deposition apparatus and methods is solved by embodiments of the present invention.

Another advantage of embodiments of the present invention includes an improved RTCVD reactor that controls the temperature of the process gas independently of the substrate temperature. The temperature difference between the gas and the substrate serves as an effective parameter for controlling conformality of the deposition process.

BRIEF DESCRIPTION OF THE DRAWINGS

The above features of the present invention will be more clearly understood from consideration of the following descriptions in connection with accompanying drawings in which:

FIG. 2 illustrates a typical power distribution between the upper lamps and lower lamps of the chamber shown in FIG. 1;

FIG. 3 shows a cross-sectional view of a semiconductor wafer exhibiting breadloafing effects and the formation of voids in the lower portion of deep trenches during CVD;

FIG. 5 shows a cross-sectional view of a semiconductor wafer manufactured in accordance with embodiments of the present invention having a deep trench exhibiting no seam voids or bread-loafing, as in the prior art;

FIG. 6 shows an embodiment of the invention having a gas cooler and a gas injection system on the side of the process chamber;

Corresponding numerals and symbols in the different figures refer to corresponding parts unless otherwise indicated. The figures are drawn to clearly illustrate the relevant aspects of the preferred embodiments and are not necessarily drawn to scale.

DETAILED DESCRIPTION OF PREFERRED EMBODIMENTS

Figure 1:
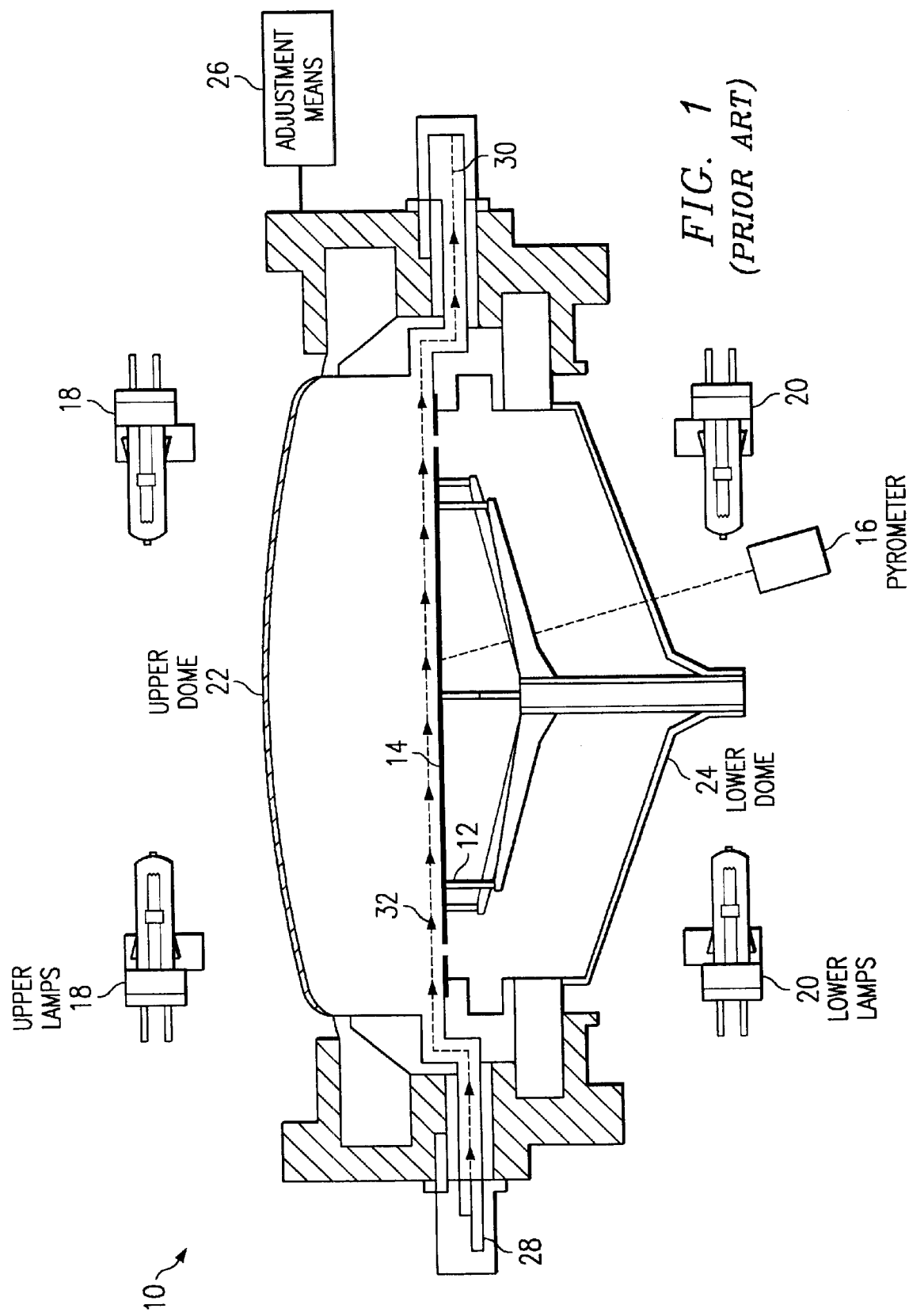
FIG. 1 illustrates a prior art chamber used for rapid thermal chemical vapor deposition (RTCVD) of a single semiconductor wafer.

U.S. patent application Ser. No. 09/895,378 filed on Jun. 29, 2001 by Gluschenkov et al., entitled "Method for Reducing the Microloading Effect in a Chemical Vapor Deposition Reactor," incorporated herein by reference, relates to the microloading effect in a RTCVD reactor. Gluschenkov et al. teach that a high growth rate makes a RTCVD reactor susceptible to the microloading effect. Gluschenkov et al. also teach that the microloading effect is substantially different from the conformality phenomena due to a different scale. Gluschenkov et al. assert that a typical microloading scale is always above 30 $\mu$m while the conformality phenomena is related to the size of one microstructure with the scale of less than 10 $\mu$m. Consequently, Gluschenkov et al. do not teach any method for improving conformality of films deposited in a RTCVD reactor.

Based on the prior art teachings, one obvious way to improve conformality of a high-growth-rate RTCVD deposition process is to offset the higher growth rate with a higher substrate temperature. However, the selection of temperature for a deposition process is generally dictated by required film properties. For instance, at a high deposition temperature the size of polysilicon grains become comparable to the size of the trench opening causing a non-uniform trench fill. Therefore, the selection of substrate temperature is limited by required film parameters to within a small range. Accordingly, it is not always practical to use substrate temperature as means of improving conformality.

Other methods of improving conformality, such as the introduction of high-energy energy particles, also have limitations. First, such an approach substantially complicates the design of process chambers, thus increasing the cost of ownership. Second, high-energy particles may introduce damage to the deposited film, degrading its quality.

What is needed in the art is a method for depositing material onto a high-aspect-ratio microstructure that improves the conformality of rapid thermal chemical vapor deposition (RTCVD) processes and avoids forming large seam voids.

What is also needed in the art is an improved rapid thermal chemical vapor deposition (RTCVD) reactor that has a means of controlling conformality of the deposition process without adversely affecting film properties.

Embodiments of the present invention achieve technical advantages by providing improved conformality of deposition processes, avoiding the formation of seam voids. The conformality of the deposition process may be controlled without adversely affecting film properties, in accordance with embodiments of the invention.

A description of a prior art apparatus and deposition method will be discussed, followed by a description of preferred embodiments of the present invention and a discussion of some advantages thereof. A single trench is shown in the cross-sectional views of the semiconductor wafers, although many trenches and other features and components of a memory cell may also be present in the semiconductor devices shown.

FIG. 1 illustrates a prior art drawing of an RTCVD apparatus 10. The apparatus 10 comprises a polysilicon process chamber that is used for RTCVD processes for single semiconductor wafers 14, e.g., a single wafer 14 is processed at a time, rather than multiple wafers 14 being processed at once, as in other types of deposition equipment.

A wafer 14 is placed on a stage 12 that may comprise a plurality of pins adapted to hold the wafer 14 and to support the wafer 14 during the deposition process. The apparatus 10 comprises a chamber that includes a transparent upper dome 22 and transparent lower dome 24, for example, although the chamber may also comprise one integral piece. Upper lamps 18 and lower lamps 20 are disposed outside the domes above the wafer 14 and the below the wafer 14, as shown. A pyrometer 16 may be coupled to the wafer 14 to detect temperature during the deposition process, for example. The chamber includes an input port 28 adapted to input and disperse chemicals and gases required for the deposition process. The chamber also includes an output port 30 adapted to expel the chemicals and gases input into the chamber.

During the deposition process, certain chemistries 32 are passed over the top surface wafer 14 while the chamber is heated with lamps 18 and 20. An adjustment means 26 exterior to the chamber is used to adjust various parameters during the deposition process. For example, the adjustment means 26 may include a knob adapted to alter the substrate temperature, increase the availability of the reactant gases, or change the pressure, as examples. The lamp 18/20 radiation passes through the transparent domes 22/24 into the chamber. In the chamber, the radiation heats both the wafer 14 substrate and the process gas. Due to a high level of heat, the lamp housing is often (optionally) water-cooled.

FIG. 2 illustrates the power dissipation ratio for upper and lower lamps 18/20 of a typical prior art RTCVD apparatus 10. The total power, for example, 12 kilowatts, is typically distributed between the upper lamps 18 and the lower lamps 20, with the upper lamps 18 comprising 55% of the power (e.g., 6.6 kilowatts), and the lower lamps 20 comprising 45% of the power (e.g., 5.4 kilowatts). The power deposition onto the wafer 14 may also be varied across the wafer surface: for example, the lamps closer to the inner portion of the wafer 14 may comprise 40% of the power and the lamps closer to the outer perimeter of the wafer 14 may comprise 60% of the power for the upper lamps 18. Similarly, the inner lamps closer to the center region of the wafer 14 may comprise 40% of the power and the outer lamps may comprise 60% of the power for the lower lamps 20. Power distributions between lamp zones are used to improve the uniformity of the deposition/anneal processes.

Using the apparatus 10 shown in FIG. 1 and the power distribution shown in FIG. 2, CVD deposition of a material on a semiconductor wafer 14 having high aspect ratio features such as trenches 48, shown in FIG. 3, has a tendency to experience bread-loafing and to form voids 52 in the deposited material 50 in the lower part of the trenches 48.

FIG. 3 shows a semiconductor wafer 14 having a substrate 42 and a pad nitride 44 deposited thereon. Deep trenches 48 have been formed in the wafer 14. A first capacitor electrode, the buried plate, (not shown) has been previously formed at the lower portion of the trenches 48 by a gas phase doping process, for example. A thin nitride layer 46 has been deposited over the wafer 14, conformally coating the top surface of the wafer, e.g., the pad nitride 44, and also conformally coating the sidewalls and bottom of the deep trenches 48.

A semiconductor material 50, which may comprise polysilicon, for example, is deposited on the wafer 14 in the RTCVD apparatus 10 shown in FIG. 1, using the power distribution for the upper and lower lamps shown in FIG. 2. As the polysilicon 50 is deposited in the trenches 48, more material 50 is deposited towards the top of the trenches 48 than at the bottom, causing what is referred to in the art as a bread-loafing effect, which causes the top part of the trenches 48 to close, leaving voids 52 in the lower part of the trenches 48. The formation of these voids 52 is undesirable in art. Furthermore, the bread-loafing effect cannot be eliminated by varying chamber pressure, substrate temperature, and the film's 50 growth rate within the acceptable ranges set forth by the throughput requirements and film quality. Therefore, in the prior art, the high growth rate of the RTCVD reactor coupled with high aspect ratio of the trenches 48 results in a substantially nonconformal deposition process.

Embodiments of the present invention improve the conformality of RTCVD processes and result in semiconductor wafers having high aspect ratio trenches without voids in materials deposited by CVD. By heating the wafer and gas mixtures in the novel approach described herein, the conformality of CVD deposition may be improved.

Figure 4:
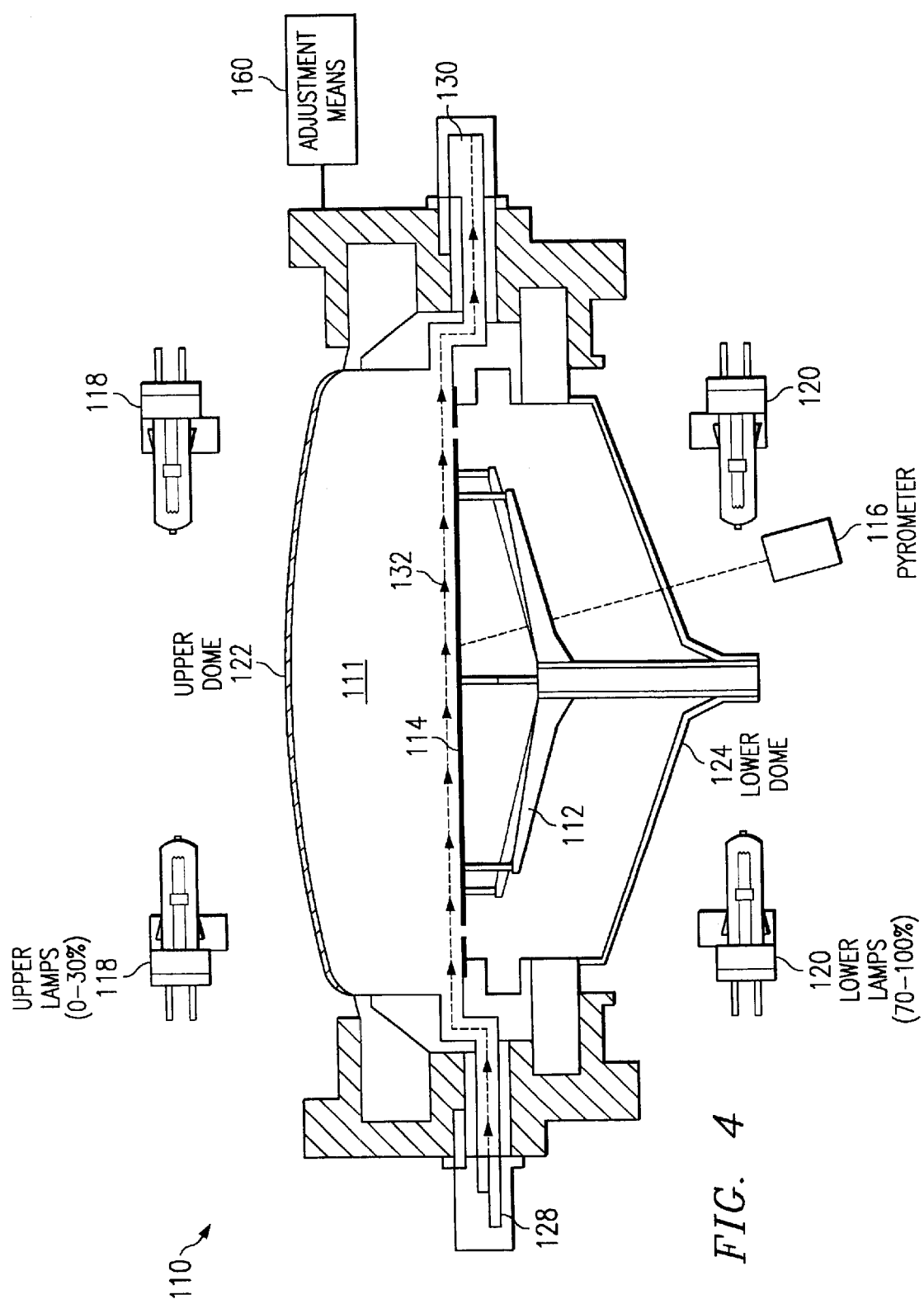
FIG. 4 illustrates an apparatus in accordance with an embodiment of the present invention, having lower lamps that are used to supply about 70–100% of the temperature and upper lamps that are used to supply about 0–30% of the temperature for a CVD process.

FIG. 4 shows an apparatus 100 in accordance with an embodiment of the present invention. The apparatus 100 may be adapted to be used for single wafer RTCVD. Alternatively, the apparatus 100 may be adapted to process a plurality of semiconductor wafers at once, for example. A wafer 114 may be placed on a stage 112 that preferably comprises a plurality of pins adapted to hold and support the wafer 114 during the deposition process. The apparatus 100 comprises a chamber 111 that includes an upper dome 122 and lower dome 124, for example, although alternatively, the chamber 111 may comprise one integral piece.

A first energy source 118 and a second energy source 120 are disposed above the stage 112 in the upper dome 122 and the below the stage 112 in the lower dome 124 of the chamber, respectively, as shown. First energy source 118 is also referred to herein as "upper lamps". First energy source 118 preferably comprises a radiant energy source, e.g., RTP lamps. As an example, first energy source 118 may comprise quartz-halogen lamps having a tungsten filament. Alternatively, first energy source 118 many comprise resistive heating elements, as an example. First energy source 118 may comprise a plurality of bulbs or lamps, for example.

Similarly, second energy source 120 is also referred to herein as "lower lamps". Second energy source 120 preferably comprises a radiant energy source, e.g., RTP lamps. As an example, second energy source may comprise quartz-halogen lamps having a tungsten filament. Alternatively, second energy source 120 many comprise resistive heating elements, as an example. Second energy source 120 may comprise a plurality of bulbs or lamps, for example.

A pyrometer 116 may be coupled to the wafer 114 to detect temperature during the deposition process, for example. The chamber includes an input port 128 adapted to input and disperse chemicals and gases required for the deposition process. The chamber also includes an output port 130 adapted to expel the chemicals and gases.

During the CVD process, chemistries 132 are passed over the top surface wafer 114 while the chamber is heated with energy sources 118 and 120. Chemistries 132 comprise reactant, source and carrier gases including the materials to be deposited on the wafer 14, for example. An adjustment means 160 exterior to the chamber is adapted to adjust the power distribution between the first and second power sources 118/120. The adjustment means 160 provides a variable power distribution of the radiant energy of the first and second energy sources 118/120.

In one embodiment, the adjustment means 160 is adapted to independently adjust the power of the first and second energy source 118 and 120. In another embodiment, adjustment means 160 may be designed such that increasing the power to first energy source 118 also decreases the power to the second energy source 120, for example. Similarly, decreasing the power to first energy source 118 may also increase the power to the second energy source 120, for example.

In accordance with a preferred embodiment of the invention, the lower lamps 120 are adapted to provide 70–100% of the temperature during the RTCVD process, and the upper lamps 118 are adapted to provide 0–30% of the temperature provided to the wafer 114 during the deposition process. The adjustment means 160 provides the ability to adjust the power of the lamps 118 and 120. For example, upper lamps 118 may be adjusted to provide 5% of the energy and lower lamps may be adjusted to provide 95% of the energy. The apparatus and method in accordance with a preferred embodiment is adapted to heat a wafer 114 and chemistries 132 within the chamber to a temperature of between about 500 to 1100 degrees C., for example.

To deposit a material 150 on a wafer 114, the wafer 114 is positioned in the chamber 111, and reactive gases 132 are introduced into the chamber 111. The gases 132 and wafer 114 are heated, wherein the gas 132 temperature in the vicinity of the wafer 114 surface is lower than the temperature of the wafer 114 surface. A material 150 (shown in FIG. 5) is deposited on the wafer 114 surface using chemical vapor deposition.

Material 150 is deposited, in accordance with embodiments of the invention, with an absence of seams and voids, demonstrating that the radiation power distribution controls uniformity of the deposition process. Therefore, altering radiation power distribution is an effective method of improving conformality of the deposition process. Advantageously, embodiments of the present method and apparatus do not require any change in substrate temperature, chamber pressure, type of the chemical precursor, or film growth rate.

The physical origin of such unusual correlation between the radiation power distribution and the conformality of deposition processes is in the way of heating the process gas. While the substrate temperature does not depend on the top-bottom radiation power distribution, the process gas temperature does depend on it. The process gas is colder than in the case shown in FIG. 1, because the heat exchange between the gas and the substrate is relatively slow while the radiation heating is fast. By removing the intense radiation source from the top of the reactor, the process gas is not heated fast enough. In the disclosed method, the heating of the substrate and process gas is effectively decoupled. Therefore, any other means of controlling independently temperatures of process gas and substrate will also provide an effective knob for controlling conformality of the deposition process.

If the process gas and the wafer have different temperatures, there will be a strong temperature gradient in the gas in close proximity to the wafer surface. It is this temperature variation within the gas that is also responsible for the observed conformality improvement.

Controlling the temperature gradient provides a way to control a local composition of the gas mixture, which in turn can be used to control local processing conditions. For example, by changing the power ratios of the upper and lower lamps 118/120 in the chamber 111, $SiH_4$ can be made more uniform throughout a trench 148 or, alternatively, more abundant in the bottom part of a trench 148 and therefore may minimize, reduce or eliminate undesirable void formation, as shown in the cross-sectional view of a wafer 114, in FIG. 5. Alternatively, a colder gas may inhibit gas phase reactions in the volume of the chamber 111 and therefore may suppress production of highly-reactive radicals with a high sticking coefficient, thus reducing or eliminating undesirable void formation, as shown in the cross-sectional view of a wafer 114 in FIG. 5.

In accordance with embodiments of the invention, by adjusting and controlling the temperature of the gas and the temperature gradient within the gas in the trenches 148 of a wafer 114 there is less deposition on the top of the wafer 114 compared to on the sidewalls of trench 148, resulting in a void-free fill of the trench 148.

Figure 7:
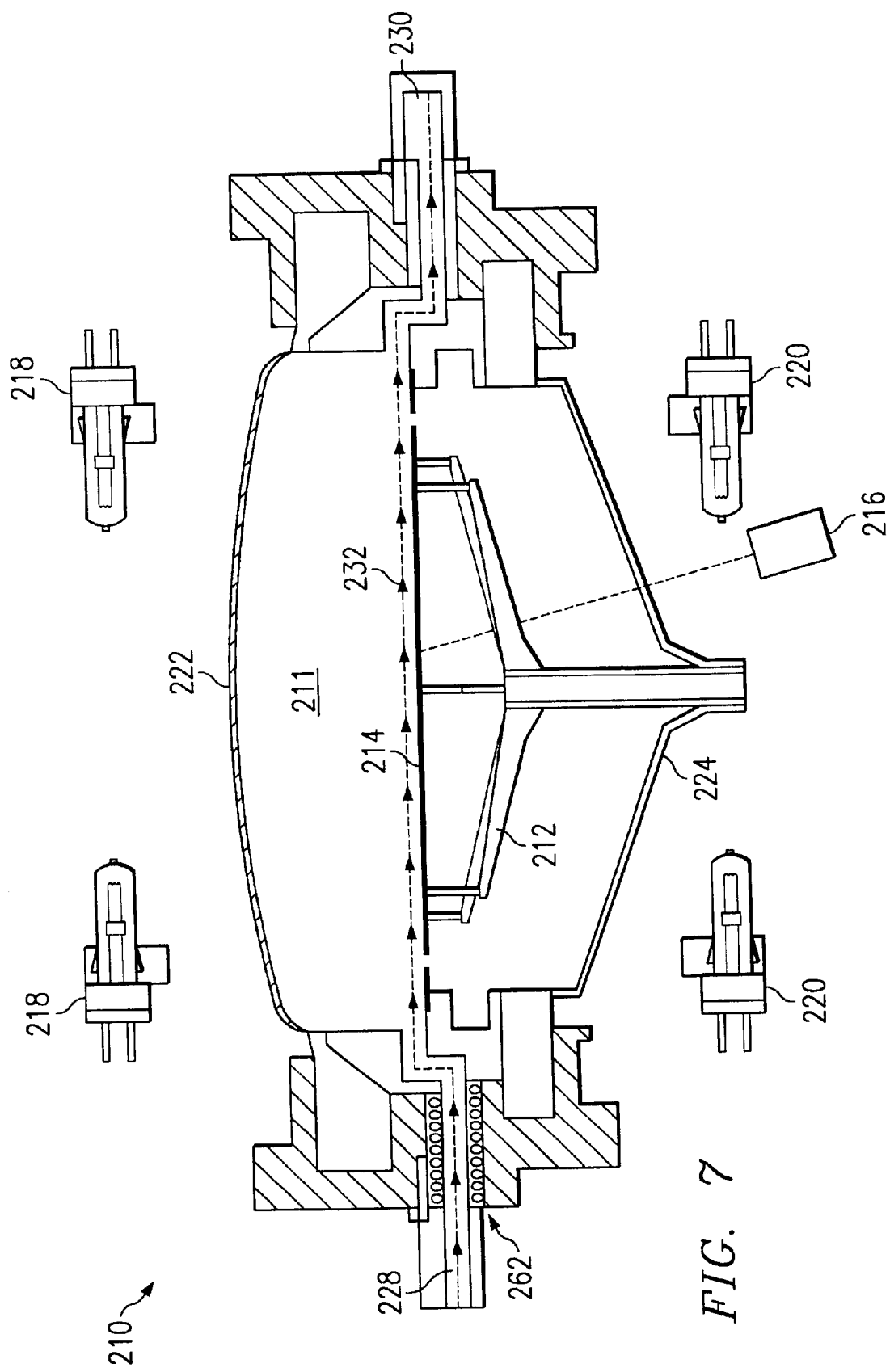
FIG. 7 shows a more detailed view of the embodiment shown in FIG. 6.

In accordance with an embodiment of the invention, the control of the conformality can be further improved in a novel RTCVD reactor. The reactor is shown in FIG. 7. The apparatus 200 may be adapted to be used for single wafer RTCVD. Alternatively, the apparatus 200 may be adapted to process a plurality of semiconductor wafers at once, for example.

A wafer 114 may be placed on a stage 112 that preferably comprises a plurality of pins adapted to hold and support the wafer 114 during the deposition process. The apparatus 200 comprises a chamber that includes an upper dome 122 and lower dome 124, for example, although alternatively, the chamber may comprise one integral piece.

A first energy source 118 and a second energy source 120 are disposed above the stage 112 in the upper dome 122 and the below the stage 112 in the lower dome 124 of the chamber, respectively, as shown. First energy source 118 is also referred to herein as "upper lamps". First energy source 118 preferably comprises a radiant energy source, e.g., RTP lamps. As an example, first energy source 118 may comprise quartz-halogen lamps having a tungsten filament. Alternatively, first energy source 118 many comprise resistive heating elements, as an example. First energy source 118 may comprise a plurality of bulbs or lamps, for example.

Similarly, second energy source 120 is also referred to herein as "lower lamps". Second energy source 120 preferably comprises a radiant energy source, e.g., RTP lamps. As an example, second energy source may comprise quartz-halogen lamps having a tungsten filament. Alternatively, second energy source 120 many comprise resistive heating elements, as an example. Second energy source 120 may comprise a plurality of bulbs or lamps, for example.

A pyrometer 116 may be coupled to the wafer 114 to detect temperature during the deposition process, for example. The chamber includes an input port 128 adapted to input and disperse chemicals and gases required for the deposition process. The chamber 111 also includes an output port 130 adapted to expel the chemicals and gases.

In an optional configuration, the first energy source is absent while providing space for the gas input port 128. The gas input port 128 is located on top of the wafer 114 and is called a showerhead. The gases are first introduced into the interior part of the showerhead where they mix. The pressure differential drives the gas mixture into the RTCVD chamber through a plurality of holes. The holes may have different conductance to improve the uniformity of the gas chemical composition in the chamber.

In accordance with an embodiment of the invention, the reactor has a subsystem located in the process gas inlet that cools the process gas before introducing it into the chamber. The subsystem includes a gas chiller and means to monitor and control the temperature of the gas. Colder process gas at the inlet, e.g., having a temperature lower than the ambient (room) temperature, results in a colder gas in the process chamber and in the proximity of the wafer, thus, increasing the temperature gradient and reducing any gas phase reactions.

FIG. 6 shows a block diagram of an embodiment of the invention having a gas cooler 262 and a gas injection system 264 coupled to the side of the process chamber 211. The gas cooler 262 utilized a flow and/or condensation of a coolant to reduce the temperature of a cooling element of the cooler 262. The flowing gas exchanges the heat with the outer surface of the cooling element. The outer surface of the cooling element is maximized to achieve a high cooling efficiency. Various coolants or cooling agents may be used in the cooler 262, such as using a metallic shroud with cold water, and coolants such as liquid nitrogen or helium, as examples. The cooler 262 may also comprise thermoelectric elements, wherein the electric current is partially converted into the heat flux supporting a particular temperature gradient.

FIG. 7 shows a more detailed view of the embodiment shown in FIG. 6. A gas cooler 262 has been incorporated into the gas injection system of the reactor. A wafer 214 is placed on a stage 212 that may comprise a plurality of pins adapted to hold the wafer 214 and to support the wafer 214 during the deposition process. The apparatus 210 comprises a chamber 211 that includes a transparent upper dome 222 and transparent lower dome 224, for example, although the chamber 211 may also comprise one integral piece. Upper lamps 218 and lower lamps 220 are disposed outside the domes above the wafer 214 and the below the wafer 214, as shown. A pyrometer 216 may be coupled to the wafer 214 to detect temperature during the deposition process, for example. The chamber includes an input port 228 adapted to input and disperse chemicals and gases required for the deposition process. The flow of each gas is controlled by an individual Mass Flow Controller (MFC), MFC1 and MFC2, which allows for a specified flow rate of gas molecules into the chamber. The chamber also includes an output port 230 adapted to expel the chemicals and gases input into the chamber.

During the deposition process, certain chemistries 232 are passed over the top surface of the wafer 214 while the chamber is heated with lamps 218 and 220. The lamp 218/220 radiation passes through the transparent domes 222/224 into the chamber. In the chamber 211, the radiation heats both the wafer 214 substrate and the process gas. In particular, in accordance with embodiments of the invention, the gas temperature in the vicinity of the wafer 214 surface is substantially lower than the temperature of the wafer 214 surface. This may be achieved, for example, by heating the wafer with substantially more energy emitted from the upper lamps 218 than from the lower lamps 220 while cooling the gas 232 with the gas cooler 262.

Figure 8:
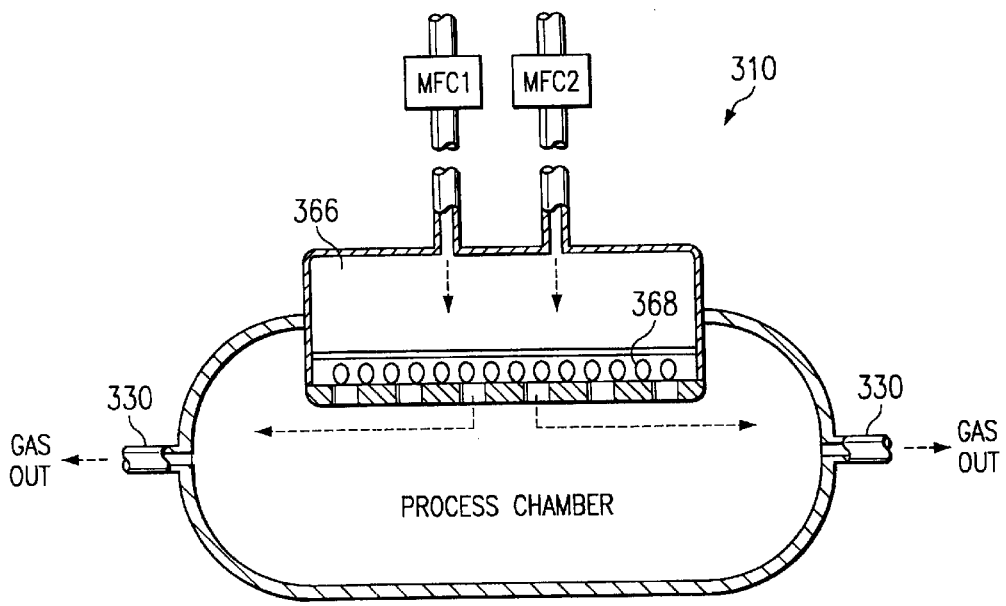
FIG. 8 shows an embodiment of the invention including a chuck-heated reactor with a gas showerhead with an embedded gas cooler.
Figure 9:
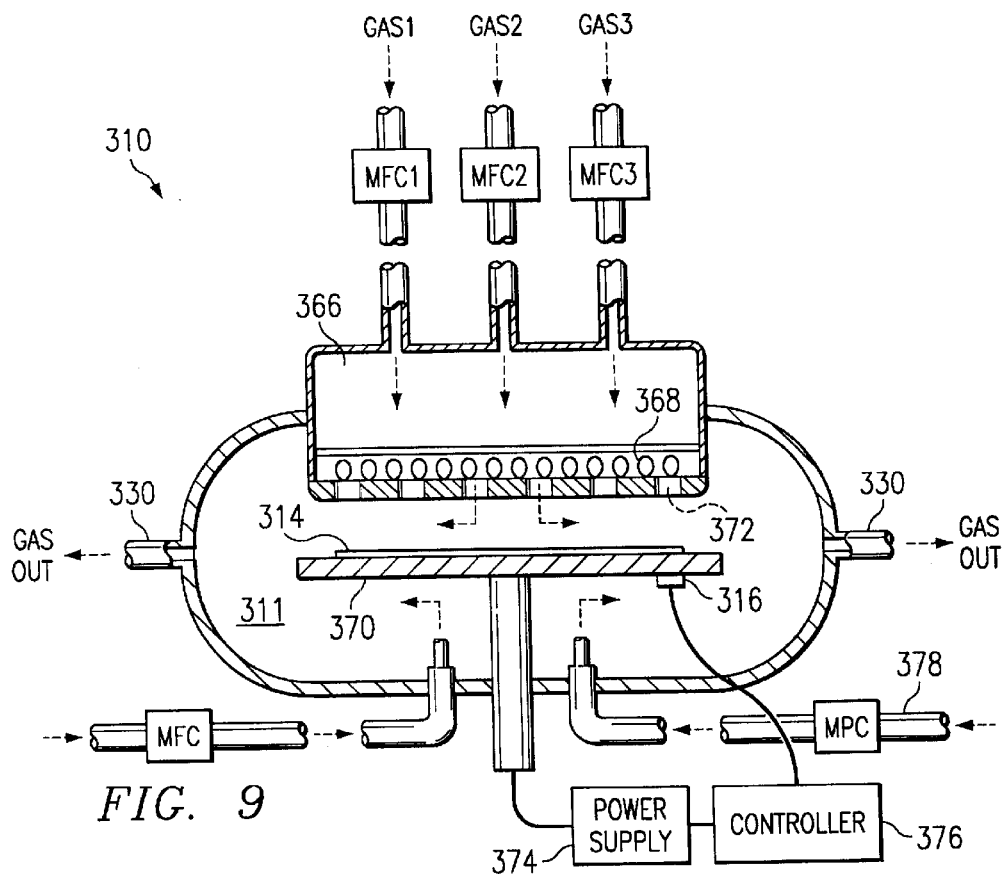
FIG. 9 shows a more detailed view of the embodiment shown in FIG. 8.

FIG. 8 shows an embodiment 310 of the invention including a chuck-heated reactor with a gas showerhead 366 including an embedded gas cooler 368. FIG. 9 shows a more detailed view of the embodiment shown in FIG. 8. A chuck 370 having a heater disposed therein supports the wafer 314 within the chamber 311. The chuck 370 may be coupled to a power supply 374 adapted to provide power for the built-in heater in the chuck 370. A plurality of gases are input into the chamber 311 by gas injection system with respective MFCs into the showerhead 366. The gas cooler 368 cools the gas mixture as it is emitted from the showerhead apertures 372 into the process chamber.

The apparatus may include a controller 376 for controlling the temperature of the wafer 314 substrate. The apparatus may also include a back-side purge system 378 with respective MFC.

When the primary coolant for the gas cooler 262/368 comprises cold water, the apparatus 210/310 may be adapted to cool the gas prior to entering the chamber 211/311 to below room temperature. When the primary coolant for the gas cooler 262/368 comprises liquid nitrogen, the apparatus 210/310 may be adapted to cool the gas prior to entering the chamber 211/311 to below around 200 to 80 Kelvin but above the gas-liquid transition temperature for any of the process gasses.

Other options for the cooler 262/368, as examples, include a thermoelectric element for the primary cooling element. The gas cooler 262/368 may be based on the condensation of a coolant into the liquid phase. The gas cooler 262/368 may be based on the adiabatic expansion of the process gas into the chamber.

The wafer support stage 112/212 or chuck 370 may be adapted to spin the wafer 114/214/314 from 0 rpm to 1000 rpm, for example. The apparatus 110/210/310 may include a wafer transfer chamber, a load lock system, a wafer cool down chamber, as examples, not shown.

Embodiments of the invention include an integrated deposition system which includes at least one apparatus 110/210/310 and one or more of the following process chambers: chemical vapor deposition (CVD), physical vapor deposition (PVD) or sputtering, rapid thermal processing (RTP), reactive ion etching (RIE), wafer cleaning, or combinations thereof. The integrated deposition system is preferably designed such that material is deposited on the semiconductor wafer while the wafer is exposed to a vacuum environment, wherein the wafer is transferable between the various chambers without breaking the vacuum.

While embodiments of the present invention are described herein with reference to a DRAM, they also have useful application in ferroelectric random access memory (FRAM) devices, magnetic random access memory (MRAM) devices, other memory devices and other semiconductor devices, as examples, particularly semiconductor devices having features with high aspect ratios. Embodiments of the invention allow void-free fill of CVD materials for features having aspect ratios of 5:1, 50:1, 100:1 or greater, as examples.

The deposition of semiconductor material has been shown in an exemplary embodiment, however, the deposition of conductive materials and insulative materials may also be achieved in accordance with embodiments of the present invention. As examples, amorphous silicon, refractory metals, silicides, other metals, oxides, and nitrides may be deposited by RTCVD while controlling and varying the temperature of the process gas and/or the thermal gradient within the process gas in close proximity to the wafer to optimize the conformality of the deposition process, as described herein.

For example, when depositing polysilicon 150 on the wafer 114 surface, chemistries 132 such as $SiH_4$, $AsH_3$, $PH_3$, $B_2H_6$, $H_2$, or a combination thereof may be used. Alternatively, disilane, dichorosilane, hexasilane or other silicon-containing gases may also be used, as examples. The active gas component may comprise less than 1% of the composition of the gas, for example. When depositing tungsten, chemistries 132 such as $WF_6$, $WCl_6$, $W(CO)_6$ or a combination thereof may be used. When depositing SiO2, chemistries 132 such as $SiH_4$, $N_2O$, $O_2$, NO or a combination thereof may be used.

Advantages of embodiments of the present invention include providing an apparatus and method for conformal deposition of materials on a semiconductor wafer. As an example, such conformal deposition processes result in seamless fill of high-aspect ratio trenches of a semiconductor wafer. The conformality of deposition on a semiconductor wafer is improved in accordance with embodiments of the invention by heating the wafer and the gas mixtures within the processing chamber such that the gas temperature and the temperature gradient within process gas in the proximity of wafer surface is controlled. The problems of bread-loafing and void formation during RTCVD processes are alleviated by the use of embodiments of the present invention.

While the invention has been described with reference to illustrative embodiments, this description is not intended to be construed in a limiting sense. Various modifications in combinations of the illustrative embodiments, as well as other embodiments of the invention, will be apparent to persons skilled in the art upon reference to the description. In addition, the order of process steps may be rearranged by one of ordinary skill in the art, yet still be within the scope of the present invention. It is therefore intended that the appended claims encompass any such modifications or embodiments. Moreover, the scope of embodiments of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A method of fabricating a semiconductor wafer, comprising:

providing a semiconductor wafer, the wafer having a surface;

positioning the wafer in a chamber;

introducing reactive gases into the chamber;

heating the gases and the wafer, wherein the gas temperature in the chamber in the vicinity of the wafer surface is more than 20% lower than the temperature of the wafer surface; and depositing a material on the wafer surface using chemical vapor deposition.

2. The method according to claim 1, wherein heating the gas and wafer comprises:

disposing a first energy source in the chamber above the wafer;

disposing a second energy source in the chamber below the wafer; and heating the wafer with the second energy source and the first energy source, wherein substantially more energy is emitted from the second energy source than from the first energy source.

3. The method according to claim 2, wherein the wafer is heated between about 0 to 30 percent by the first energy source and between about 70 to 100 percent by the second energy source.

4. The method according to claim 3, further comprising adjusting the percentage of energy used between the first and second energy sources.

5. The method according the claim 1, wherein the wafer comprises trenches having an aspect ratio of 5:1 or greater.

6. The method according to claim 5, wherein the wafer comprises trenches having an aspect ratio of 50:1 or greater.

7. The method according to claim 1, wherein heating the wafer comprises heating the wafer to a temperature of between about 500 to 1100 degrees C.

8. The method according to claim 1, wherein depositing a material comprises depositing a semiconductor material, insulative material, or conductive material.

9. The method according to claim 8, wherein depositing a material comprises depositing polysilicon.

10. The method according to claim 9, wherein depositing a material comprises depositing exposing the wafer to $SiH_4$, $AsH_3$, $H_2$, or a combination thereof.

11. The method according to claim 2, wherein the first and second energy sources comprise rapid thermal processing (RTP) lamps.

12. A semiconductor wafer processed by the method described in claim 1.

13. The semiconductor wafer according to claim 12, wherein the wafer comprises a memory device.

14. The semiconductor wafer according to claim 13, wherein the memory device comprises a dynamic random access memory (DRAM) device.

15. The semiconductor wafer according to claim 12, wherein the wafer comprises trenches having an aspect ratio of 5:1 or greater.

16. The semiconductor wafer according to claim 15, wherein the wafer comprises trenches having an aspect ratio of 50:1 or greater.

17. A method of fabricating a semiconductor wafer, comprising:
   providing a semiconductor wafer, the wafer having a surface;
   positioning the wafer in a chamber;
   disposing a first energy source in the chamber above the wafer proximate the wafer surface;
   disposing a second energy source in the chamber below the wafer;
   introducing reactive gases into the chamber;
   heating the gases and wafer with the second energy source and the first energy source such that the gas temperature in the vicinity of the wafer surface is less than the temperature of the wafer surface, wherein substantially more energy is emitted from the second energy source than from the first energy source; and
   depositing a material on the wafer surface using chemical vapor deposition.

18. The method according to claim 17, wherein the wafer is heated between about 0 to 30 percent by the first energy source and between about 70 to 100 percent by the second energy source.

19. The method according to claim 17, further comprising heating the gases, wherein the wafer comprises a surface, wherein the gas temperature in the vicinity of the wafer surface is more than 20% lower than the temperature of the wafer surface.

20. The method according to claim 1, wherein providing a semiconductor wafer comprises providing a wafer having non-planar structures with a 3-D surface.

* * * * *